US010249788B2

(12) United States Patent
Cheng

(10) Patent No.: US 10,249,788 B2
(45) Date of Patent: Apr. 2, 2019

(54) SEMICONDUCTOR SUBSTRATE, SEMICONDUCTOR DEVICE AND MANUFACTURING METHOD OF SEMICONDUCTOR SUBSTRATE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

(*) Notice: Subject to any disclaimer, the term of this patent is extended or adjusted under 35 U.S.C. 154(b) by 0 days.

(21) Appl. No.: 15/201,533

(22) Filed: Jul. 4, 2016

(65) Prior Publication Data
US 2016/0315220 A1 Oct. 27, 2016

Related U.S. Application Data

(63) Continuation of application No. PCT/CN2015/070251, filed on Jan. 7, 2015.

(30) Foreign Application Priority Data

Jan. 7, 2014 (CN) .......................... 2014 1 0006568

(51) Int. Cl.
*H01L 29/15* (2006.01)
*H01L 29/20* (2006.01)
(Continued)

(52) U.S. Cl.
CPC ............ *H01L 33/12* (2013.01); *H01L 21/187* (2013.01); *H01L 21/2007* (2013.01);
(Continued)

(58) Field of Classification Search
None
See application file for complete search history.

(56) References Cited

U.S. PATENT DOCUMENTS 5,981,400 A 11/1999 Lo
6,333,208 B1 * 12/2001 Li ......................... H01L 21/187
257/E21.088
(Continued)

FOREIGN PATENT DOCUMENTS

CN 101017864 A 8/2007
CN 102208337 A 10/2011
(Continued)

OTHER PUBLICATIONS

PCT International Search Report for PCT/CN2015/070251 (priority application), dated Apr. 9, 2015.
(Continued)

*Primary Examiner* — Joseph C. Nicely
*Assistant Examiner* — Lamont B Koo
(74) *Attorney, Agent, or Firm* — Flener IP & Business Law, LLC; Zareefa B. Flener

(57) ABSTRACT

A semiconductor substrate, a semiconductor device and a manufacturing method of the semiconductor substrate are provided. The semiconductor substrate comprises a first semiconductor layer and a second semiconductor layer located on the first semiconductor layer. The first semiconductor layer and the second semiconductor layer, as well as semiconductor layers obtained by symmetrically rotating the first semiconductor layer and the second semiconductor layer according to their respective lattice structures, have different cleavage planes in a vertical direction. By providing the semiconductor substrates having composite structures, even if thicknesses of the substrates are not changed, the damages to the semiconductor substrates due to stresses by the semiconductor epitaxial layers can be reduced, thereby decreasing the likelihood of breakage of the semiconductor substrates. Furthermore, the processing difficulty
(Continued)

is reduced and the reliability of the semiconductor devices is improved.

12 Claims, 5 Drawing Sheets

(51) Int. Cl.
  *H01L 33/12* (2010.01)
  *H01L 21/20* (2006.01)
  *H01L 33/00* (2010.01)
  *H01L 33/18* (2010.01)
  *H01L 33/26* (2010.01)
  *H01L 21/18* (2006.01)

(52) U.S. Cl.
  CPC ...... *H01L 33/0066* (2013.01); *H01L 33/0075* (2013.01); *H01L 33/18* (2013.01); *H01L 33/26* (2013.01)

(56) References Cited

U.S. PATENT DOCUMENTS

| | | | | |
|---|---|---|---|---|
| 2006/0186416 A1* | 8/2006 | Furukawa | ......... | H01L 21/76254 257/77 |
| 2006/0292744 A1* | 12/2006 | Enquist | ............... | H01L 21/2007 438/107 |
| 2012/0018764 A1* | 1/2012 | Choi | ....................... | H01L 33/20 257/99 |
| 2012/0104390 A1* | 5/2012 | Bedell | ................. | H01L 21/0245 257/49 |
| 2012/0119223 A1 | 5/2012 | Weeks, Jr. et al. | | |
| 2013/0323906 A1* | 12/2013 | Kim | .................. | H01L 21/02694 438/458 |

FOREIGN PATENT DOCUMENTS

| | | |
|---|---|---|
| CN | 102978695 A | 3/2013 |
| CN | 103035496 A | 4/2013 |
| JP | S63193517 A | 8/1988 |
| JP | H07335511 A | 12/1995 |
| JP | 2009-40639 A | 2/2009 |

OTHER PUBLICATIONS

PCT Written Opinion for PCT/CN2015/070251 (priority application), dated Apr. 13, 2015.
SIPO Office Action for CN201410006568.4 (priority application), dated Dec. 2, 2015.
European Search Report for counterpart application No. 15735020.8-1555/3093891, dated Dec. 12, 2016.
Japanese Office Action in counterpart Application No. 2016-544829, dated Jul. 20, 2017.

* cited by examiner

SEMICONDUCTOR SUBSTRATE, SEMICONDUCTOR DEVICE AND MANUFACTURING METHOD OF SEMICONDUCTOR SUBSTRATE

CROSS-REFERENCE TO RELATED APPLICATIONS

This application is a continuation of international application No. PCT/CN2015/070251 filed on Jan. 7, 2015, titled "Semiconductor Substrate, Semiconductor Device and Manufacturing Method for Semiconductor Substrate", which claims the benefit and priority of Chinese patent application No. 201410006568.4 filed on Jan. 7, 2014, titled "Semiconductor Substrate, Semiconductor Device and Manufacturing Method for Semiconductor Substrate". Both of these applications are incorporated herein in their entirety by reference.

TECHNICAL FIELD

The present invention relates to microelectronics, and more particularly to a semiconductor substrate, a semiconductor device and a manufacturing method of the semiconductor substrate.

BACKGROUND

III group nitrides, such as gallium nitride, draw more and more attentions because they can be widely used in light-emitting diodes (LEDs) of semiconductor lighting devices as well as high-power electronic devices. Due to lack of intrinsic substrates, gallium nitride devices are generally prepared on heterogeneous substrates, such as sapphire, silicon carbide and silicon. Due to their wide applications, silicon substrates have the best size and quality among the above-mentioned substrate materials. Currently, complementary metal oxide semiconductors (CMOSs) are mainly manufactured based on 12-inch silicon substrates. In addition, silicon has the best economy among the above-mentioned substrate materials. Therefore, the best way to reduce costs of gallium nitride based devices is to prepare gallium nitride materials on large-sized silicon substrates.

However, because there are huge lattice mismatch and thermal mismatch between gallium nitride and silicon, a lot of stresses will be introduced during the processes of preparation and cooling. Such stresses will result in warping of epitaxial layers and cracking of epitaxial films, and bring damages to the silicon substrates themselves. Due to residual stresses in the silicon substrates, gallium nitride epitaxial layers on the silicon wafers may be broken during the manufacturing processes, thereby bringing huge losses. To avoid this, a usual approach is to use thick silicon substrates. However, there is a limit for thicknesses of the substrates due to processing conditions. If a thickness of a silicon substrate exceeds a certain threshold, the substrate cannot be treated by processing apparatus, for example, it cannot be focused and aligned by a lithography apparatus, thus the processing cannot be implemented.

Therefore, in view of the above-mentioned technical problems and improvement methods, it is necessary to provide a semiconductor substrate, a semiconductor device and a manufacturing method of the semiconductor substrate.

SUMMARY

In order to resolve the above-mentioned problems, the present invention proposes a composite substrate structure.

Generally speaking, due to symmetry, it is preferable that gallium nitride epitaxial wafers are prepared on Si (111) substrates, so that the prepared epitaxial films have good crystal quality, electrical and optical properties. A lattice structure of gallium nitride has a characteristic of hexagonal symmetry, release of stresses follows the same relationship. Cleavage planes of Si (111) have a characteristic of triangle symmetry, thus damages to silicon substrates due to stresses are triangle symmetrical. Due to the symmetrical matching relationship, a semiconductor having gallium nitride crystal prepared on Si (111) has the best quality but is most likely to be broken when subjecting stresses. To avoid this, the present invention proposes to prepare a gallium nitride epitaxial layer using an asymmetric composite silicon substrate.

Stresses inside a silicon semiconductor are accumulated as a thickness of silicon in a same crystallographic direction increases. When a surface of silicon in a certain crystallographic direction contacts with a surface of silicon in another crystallographic direction, the stresses will be reduced, rather than being accumulated. In the present invention, by introducing two or more layers of Si (111) having different crystallographic directions and making cleavage planes of Si (111) semiconductor layers which are contacted with each other do not coincide, damages to the silicon substrates by stresses are reduced. Therefore, breakage of gallium nitride semiconductor layer caused by cracking of the silicon substrates can be avoided, and robustness and reliability of the gallium nitride semiconductor layer can be improved.

The above-mentioned composite substrate may also be formed by combining two semiconductor layers having different crystallographic directions, e.g., by combining a Si (111) semiconductor layer and a Si (100) semiconductor layer. By controlling bonding angles of silicon wafers, the cleavage planes of the Si (111) semiconductor layer and the Si (100) semiconductor layer do not coincide, damages will be reduced greatly when they are transferred from the gallium nitride epitaxial layer to one of the silicon semiconductor layers, and will be avoided to be transferred to the other silicon semiconductor layer. Therefore, the likelihood of breakage of the substrates due to stresses on the gallium nitride epitaxial layers will be reduced, robustness and reliability of the substrates is improved.

The above-mentioned composite substrate can be formed using a wafer bonding method, for example, by arranging two thin substrates to make their crystallographic directions be staggered and then bonding them.

To achieve the above-mentioned objects, embodiments of the present invention provide the following technical schemes.

A semiconductor substrate comprises a first semiconductor layer and a second semiconductor layer located on the first semiconductor layer; wherein the first semiconductor layer and the second semiconductor layer have different cleavage planes in a vertical direction; a semiconductor layer obtained by symmetrically rotating the first semiconductor layer according to a lattice structure of the first semiconductor layer has a different cleavage plane in the vertical direction as that of the second semiconductor layer; a semiconductor layer obtained by symmetrically rotating the second semiconductor layer according to a lattice structure of the second semiconductor layer has a different cleavage plane in the vertical direction as that of the first semiconductor layer; or the semiconductor layer obtained by symmetrically rotating the first semiconductor layer according to the lattice structure of the first semiconductor layer and the semiconductor layer obtained by symmetrically rotating the second semiconductor layer according to the lattice structure of the second semiconductor layer have different cleavage planes in the vertical direction.

As a further improvement of the present invention, the first semiconductor layer and the second semiconductor layer have a same material or different materials.

As a further improvement of the present invention, the first semiconductor layer and the second semiconductor layer have a same lattice structure, a same crystallographic direction in the vertical direction, and non-coincident crystallographic directions in a horizontal direction.

As a further improvement of the present invention, the first semiconductor layer and the second semiconductor layer have different lattice structures, and non-coincident crystallographic directions in a horizontal direction.

As a further improvement of the present invention, a material of the first semiconductor layer is one of a crystalline material and an amorphous material or a combination thereof.

As a further improvement of the present invention, the material of the first semiconductor layer is the amorphous material, the amorphous material comprises a non-semiconductor material, the non-semiconductor material is one of aluminum nitride, polycrystalline silicon carbide, ceramics and quartz.

As a further improvement of the present invention, the material of the first semiconductor layer is the amorphous material, a bonding direction of the first semiconductor layer and the second semiconductor layer is not limited.

As a further improvement of the present invention, the second semiconductor layer is a crystalline layer.

As a further improvement of the present invention, the first semiconductor layer and the second semiconductor layer are laminated sequentially and alternately to form a laminated structure having three or more layers.

As a further improvement of the present invention, the laminated structure comprises a dielectric layer between the first semiconductor layer and the second semiconductor layer.

As a further improvement of the present invention, the dielectric layer and an adjacent first semiconductor layer have a same crystallographic direction in the vertical direction, and non-coincident crystallographic directions in a horizontal direction; and/or, the dielectric layer and an adjacent second semiconductor layer have a same crystallographic direction in the vertical direction, and non-coincident crystallographic directions in the horizontal direction.

As a further improvement of the present invention, the dielectric layer and an adjacent first semiconductor layer have different crystal structures, and non-coincident crystallographic directions in a horizontal direction; and/or, the dielectric layer and an adjacent second semiconductor layer have different crystal structures, and non-coincident crystallographic directions in the horizontal direction.

A semiconductor device comprises a semiconductor substrate and a semiconductor epitaxial layer located on the semiconductor substrate, the semiconductor substrate is a semiconductor substrate according to any of the above-described embodiments.

As a further improvement of the present invention, the semiconductor epitaxial layer comprises one of silicon, gallium arsenide, gallium nitride, aluminum gallium nitride, indium gallium nitride, aluminum gallium indium nitrogen or a combination thereof.

As a further improvement of the present invention, the semiconductor device is one of a light emitting diode, a laser diode, a high electron mobility transistor, a field effect transistor, a Schottky diode, a PIN diode and a solar cell.

A manufacturing method of a semiconductor substrate comprises:

S1. providing a first semiconductor layer;

S2. preparing a second semiconductor layer on the first semiconductor layer, wherein the first semiconductor layer and the second semiconductor layer have different cleavage planes in a vertical direction; a semiconductor layer obtained by symmetrically rotating the first semiconductor layer according to a lattice structure of the first semiconductor layer has a different cleavage plane in the vertical direction as that of the second semiconductor layer; a semiconductor layer obtained by symmetrically rotating the second semiconductor layer according to a lattice structure of the second semiconductor layer has a different cleavage plane in the vertical direction as that of the first semiconductor layer; or the semiconductor layer obtained by symmetrically rotating the first semiconductor layer according to the lattice structure of the first semiconductor layer and the semiconductor layer obtained by symmetrically rotating the second semiconductor layer according to the lattice structure of the second semiconductor layer have different cleavage planes in the vertical direction.

As a further improvement of the present invention, after the step S2, the method further comprises: preparing a semiconductor epitaxial layer on the second semiconductor layer.

As a further improvement of the present invention, the first semiconductor layer and the second semiconductor layer are prepared with one of a Czochralski method, a zone melting method, a physical vapor deposition method and a chemical vapor deposition method or a combination thereof.

As a further improvement of the present invention, in the step S2, wafer bonding is used to prepare the second semiconductor layer on the first semiconductor layer.

As a further improvement of the present invention, the semiconductor epitaxial layer is prepared with one of a metal organic chemical vapor deposition method, a molecular beam epitaxy method and a hydride vapor phase epitaxy method or a combination thereof.

As a further improvement of the present invention, after the step S2, the method further comprises: preparing the first semiconductor layer on the second semiconductor layer to form a laminated structure having three layers; or, preparing the first semiconductor layer and the second semiconductor layer sequentially and alternately on the second semiconductor layer to form a laminated structure having more than three layers.

As a further improvement of the present invention, the method further comprises: growing a dielectric layer between the first semiconductor layer and the second semiconductor layer.

As a further improvement of the present invention, the dielectric layer is made with one of deposition, thermal oxidation and nitridation, the deposition is one of CVD, PECVD, LPCVD, RTCVD, MOCVD, MBE, ALD or a combination thereof.

The substrates according to the present invention have special lattice structures and mechanical structures. By providing the semiconductor substrates having composite structures, even if thicknesses of the substrates are not changed, the damages to the silicon substrates due to stresses by the semiconductor epitaxial layers can be reduced, thereby decreasing the likelihood of breakage of the silicon substrates. Furthermore, the processing difficulty is reduced and the reliability of the semiconductor devices is improved.

BRIEF DESCRIPTION OF DRAWINGS

In order to illustrate embodiments of the present invention or the prior art more clearly, hereinafter a simple introduction is made to the accompanying drawings used in the description of the embodiments or the prior art. It is obvious for those skilled in the art that the accompanying drawings just illustrate some embodiments of the present invention, and other accompanying drawings can be obtained based on the current accompanying drawings without inventive work. In the drawings.

DETAILED DESCRIPTION

Figure 1:
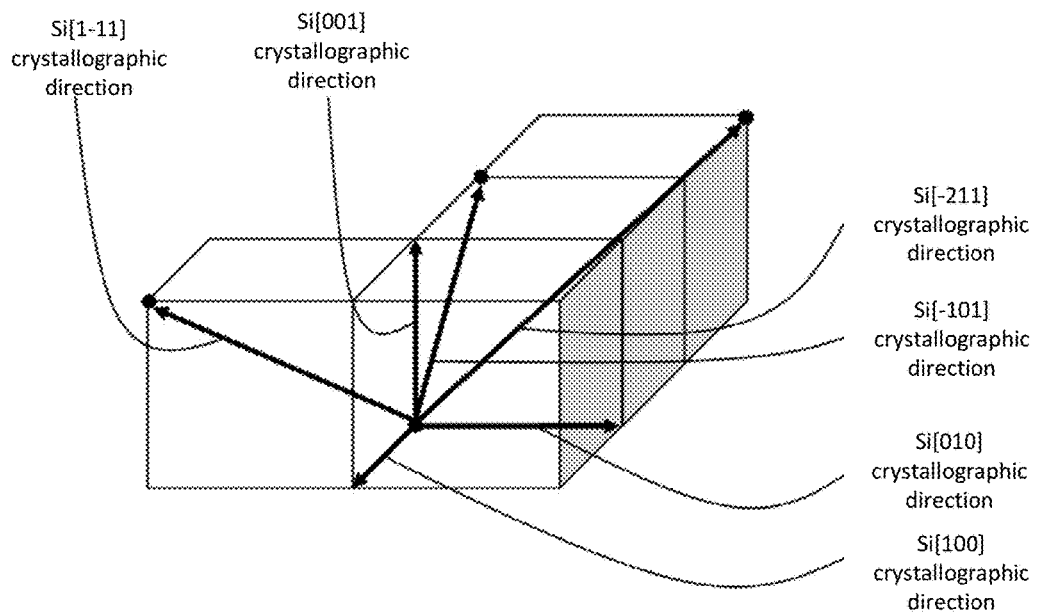
FIG. 1 is a schematic view illustrating various crystallographic directions of silicon mentioned in the present invention.

The present invention will be described in detail hereinafter with reference to the specific embodiments in conjunction with the accompanying drawings. However, the present invention is not limited to the embodiments, rather, any modification of structures, methods or functions by those skilled in the art based on these embodiments is included within the scope of this invention.

In addition, like reference numerals may be used in different embodiments. Such a repeat is just for simple and clear description of the present invention, and does not imply that there is any correlation between the different embodiments and/or structures.

FIG. 1 is a schematic view illustrating various crystallographic directions of silicon mentioned in the present invention. Hereinafter the present invention will be described further with reference to FIG. 1 and various embodiments.

Figure 2:
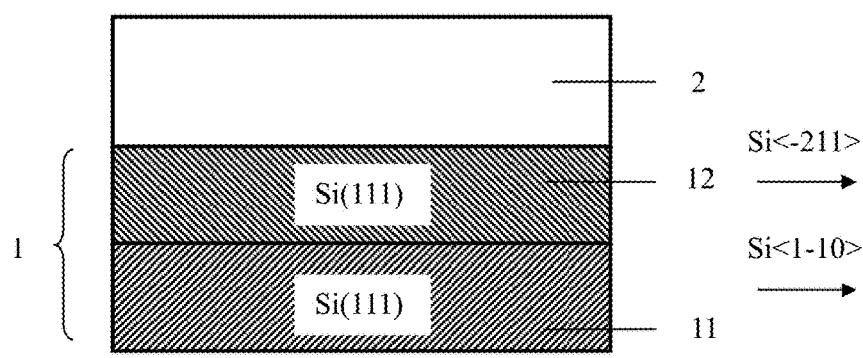
FIG. 2 is a schematic view of a semiconductor substrate according to a first embodiment of the present invention in which the <−211> direction of an upper Si (111) layer and the <1-10> direction of a lower Si (111) layer is parallel.

FIG. 2 is a schematic view of a semiconductor substrate according to a first embodiment of the present invention in which the <−211> direction of an upper Si (111) layer and the <1-10> direction of a lower Si (111) layer is parallel. In this embodiment, a semiconductor substrate 1 comprises a first semiconductor layer 11 and a second semiconductor layer 12 located on the first semiconductor layer 11, the second semiconductor layer 12 may be used for preparing a semiconductor epitaxial layer 2 thereon. The first semiconductor layer 11 and the second semiconductor layer 12 have different cleavage planes in a vertical direction.

Preferably, the first semiconductor layer 11 may be made by one of a semiconductor material, an amorphous material and crystals or a combination thereof. The semiconductor material may be one of Si, GaN, AlN, SiC, GaAs, InP, diamond or a combination thereof. The amorphous material may be aluminum nitride, ceramics or quartz. When the first semiconductor layer 11 is made of an amorphous material, the bonding directions of the first semiconductor layer 11 and the second semiconductor layer 12 are not limited.

The second semiconductor layer 12 may be a crystal layer. A semiconductor material used by the second semiconductor layer 12 may be one of Si, GaN, AlN, SiC, GaAs, InP, diamond or a combination thereof. The materials of the first semiconductor layer 11 and the second semiconductor layer 12 may be the same or different, but have non-coincident crystallographic directions. For example, the first semiconductor layer and the second semiconductor layer have the same lattice structure, the same crystallographic direction in a vertical direction, but non-coincident crystallographic directions in a horizontal direction. As another example, the first semiconductor layer and the second semiconductor layer have different lattice structures, and non-coincident crystallographic directions in the horizontal direction.

In this embodiment, the first semiconductor layer 11 and the second semiconductor layer 12 may have the same lattice structure of Si (111), the same crystallographic direction in the vertical direction, but different crystal symmetries in the horizontal direction.

The semiconductor epitaxial layer 2 may include one of silicon, gallium arsenide, gallium nitride, aluminum gallium nitride, indium gallium nitride, aluminum gallium indium nitrogen or a combination thereof. When the epitaxial layer is made of a nitride, it can be used to form a variety of device structures, such as light emitting diodes (LEDs), laser diodes, high electron mobility transistors (HEMTs), field effect transistors (FETs), Schottky diodes, PIN diodes and solar cells.

In this embodiment, a manufacturing method of the above-described semiconductor substrate 1 is provided, comprising the steps of:

S1. providing a first semiconductor layer 11;

S2. preparing a second semiconductor layer 12 on the first semiconductor layer 11, the first semiconductor layer 11 and the second semiconductor layer 12 having different cleavage planes in a vertical direction.

Further, after the step S2, the method may further comprise: preparing a semiconductor epitaxial layer 2 on the second semiconductor layer 12.

In another embodiment of the present invention, in order to manufacture a substrate having a laminated structure including three semiconductor layers, after the step S2, the method may further comprise:

preparing a first semiconductor layer 13 on the second semiconductor layer 12 so as to form a laminated structure including three layers. Here, the first semiconductor layers 11 and 13 have the same lattice structure, the same crystallographic direction in the vertical direction, and coincident or non-coincident crystallographic directions in the horizontal direction.

Furthermore, in still another embodiment of the present invention, in order to manufacture a substrate having a laminated structure including more than three semiconductor layers, after the step S2, the method may further comprise:

alternately preparing a first semiconductor layer 13 and a second semiconductor layer on the second semiconductor layer 12 so as to form a laminated structure including more than three layers.

In this embodiment, both of the first semiconductor layer 11 and the second semiconductor layer 12 comprise Si (111) semiconductor layers. The <−211> direction of the second semiconductor layer 12, i.e., the upper Si (111) semiconductor layer, and the <1-10> direction of the first semiconductor layer 11, i.e., the lower Si (111) semiconductor layer, are parallel to each other. In other embodiments, the <−211> direction of the second semiconductor layer 12 and the <1-10> direction of the first semiconductor layer 11 may have an angle therebetween, such as 10°, 20° or 30° or the like. The first semiconductor layer 11 and the second semiconductor layer 12 may be alternately laminated to form a composite structure, such that cleavage planes of the upper Si (111) semiconductor layer and the lower Si (111) semiconductor layer are staggered with each other. Compared with a single silicon semiconductor layer, with this embodiment, accumulation of stresses at interfaces between the upper Si (111) semiconductor layer and the lower Si (111) semiconductor layer is decreased. Therefore, diffusion of stresses accumulated locally in the silicon semiconductor layer to the whole silicon semiconductor layer is avoided and thus cracking of the whole silicon substrate is avoided.

Figure 3:
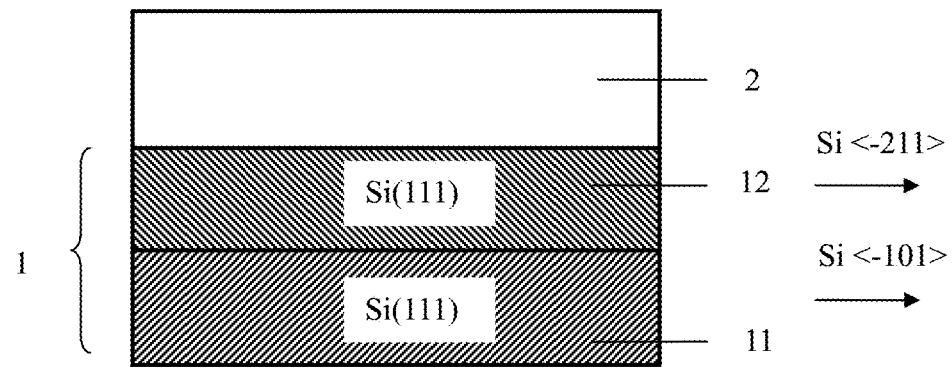
FIG. 3 is a schematic view of a semiconductor substrate according to a second embodiment of the present invention in which the <−211> direction of an upper Si (111) layer and the <−101> direction of a lower Si (111) layer is parallel.

FIG. 3 is a schematic view of a semiconductor substrate according to a second embodiment of the present invention in which the <−211> direction of an upper Si (111) layer and the <−101> direction of a lower Si (111) layer is parallel. In this embodiment, a semiconductor substrate 1 comprises a first semiconductor layer 11 and a second semiconductor layer 12 located on the first semiconductor layer 11, the second semiconductor layer 12 may be used for preparing a semiconductor epitaxial layer 2 thereon.

The first semiconductor layer 11 comprises a lower Si (111) semiconductor layer, and the second semiconductor layer 12 comprises an upper Si (111) semiconductor layer. The <−211> direction of the upper Si (111) semiconductor layer and the <−101> direction of the lower Si (111) semiconductor layer are parallel to each other. Preferably, the first semiconductor layer 11 and the second semiconductor layer 12 may be alternately laminated to form a composite structure. With this embodiment, the cleavage planes of the upper Si (111) semiconductor layer and the lower Si (111) semiconductor layer are not in the same direction, thus cracking of the silicon substrate due to accumulation of stresses can be avoided, and reliability of the substrate is greatly improved.

Figure 4A:
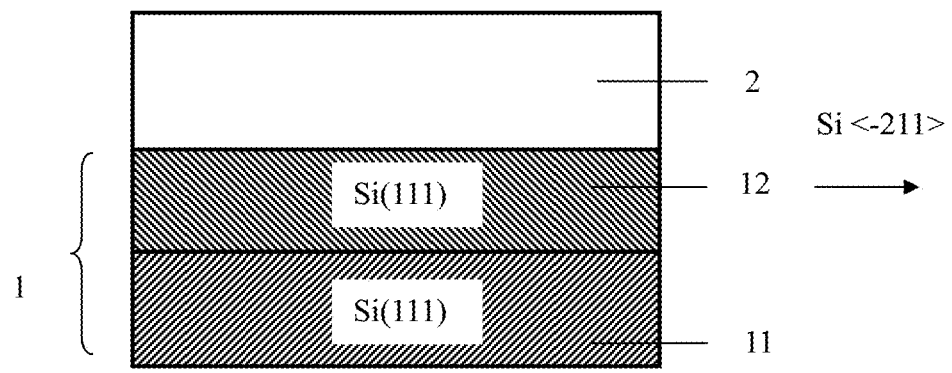
FIG. 4(a) is a schematic view of a semiconductor substrate according to a third embodiment of the present invention in which the <−211> direction of an upper Si (111) layer and the <−211> direction of a lower Si (111) layer have an angle therebetween.
Figure 4B:
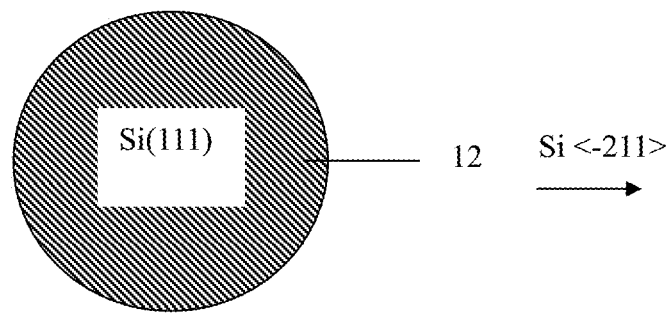
FIGS. 4(b) and 4(c) are plan views illustrating the upper Si (111) layer and the lower Si (111) layer respectively.
Figure 4C:
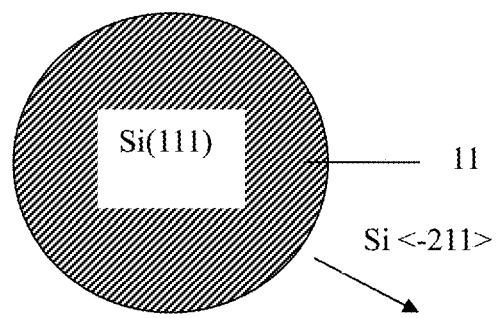

FIGS. 4(a), 4(b) and 4(c) are schematic views of a semiconductor substrate according to a third embodiment of the present invention in which the <−211> direction of an upper Si (111) layer and the <−211> direction of a lower Si (111) layer have an angle therebetween. Here, FIG. 4(a) is a schematic cross-sectional view, and FIGS. 4(b) and 4(c) are plan views illustrating the upper Si (111) layer and the lower Si (111) layer respectively. In this embodiment, a semiconductor substrate 1 comprises a first semiconductor layer 11 and a second semiconductor layer 12 located on the first semiconductor layer 11, the second semiconductor layer 12 may be used for preparing a semiconductor epitaxial layer 2 thereon.

The first semiconductor layer 11 comprises a lower Si (111) semiconductor layer, and the second semiconductor layer 12 comprises an upper Si (111) semiconductor layer. The <−211> direction of the upper Si (111) semiconductor layer and the <−211> direction of the lower Si (111) semiconductor layer have an angle therebetween. The angle is an angle other than 60° nor an integer multiple of 60°. Preferably, the first semiconductor layer 11 and the second semiconductor layer 12 may be alternately laminated to form a composite structure. With this embodiment, the cleavage planes of the upper Si (111) semiconductor layer and the lower Si (111) semiconductor layer are not in the same direction, thus cracking of the silicon substrate due to accumulation of stresses can be avoided, and reliability of the substrate is greatly improved.

Figure 5A:
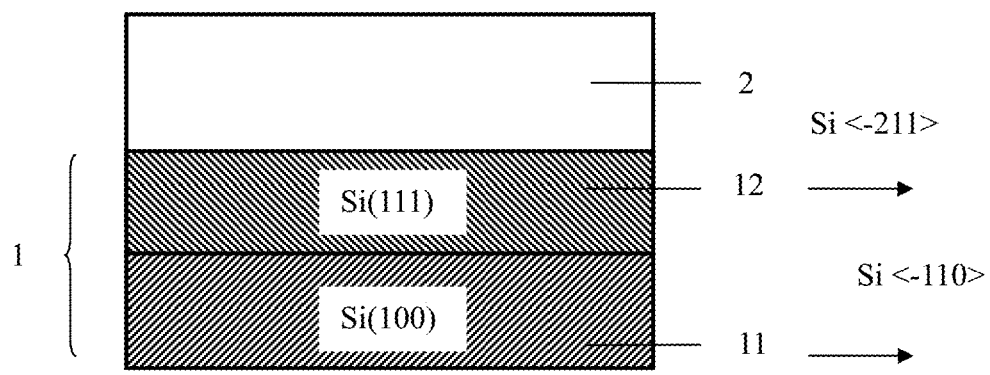
FIG. 5(a) is a schematic view of a semiconductor substrate according to a fourth embodiment of the present invention in which the <−211> direction of an upper Si (111) layer and the <−110> direction of a lower Si (100) layer have an angle therebetween.
Figure 5B:
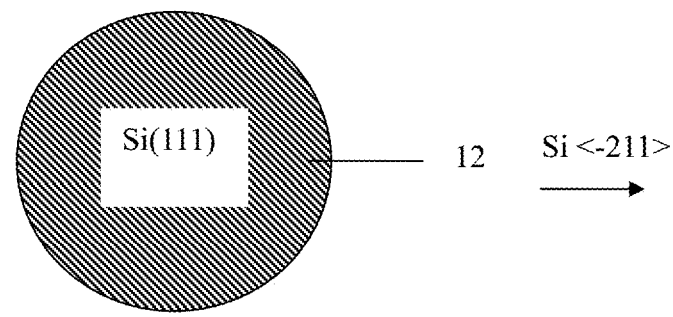
FIGS. 5(b) and 5(c) are plan views illustrating the upper Si (111) layer and the lower Si (100) layer respectively.
Figure 5C:
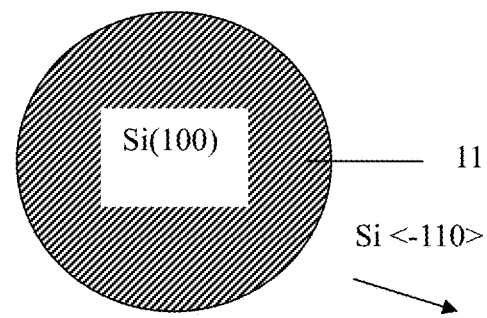

FIGS. 5(a), 5(b) and 5(c) are schematic views of a semiconductor substrate according to a fourth embodiment of the present invention in which the <−211> direction of an upper Si (111) layer and the <−110> direction of a lower Si (100) layer have an angle therebetween. Here, FIG. 5(a) is a schematic cross-sectional view, and FIGS. 5(b) and 5(c) are plan views illustrating the upper Si (111) layer and the lower Si (100) layer respectively. In this embodiment, a semiconductor substrate 1 comprises a first semiconductor layer 11 and a second semiconductor layer 12 located on the first semiconductor layer 11, the second semiconductor layer 12 may be used for preparing a semiconductor epitaxial layer 2 thereon. In this embodiment, the first semiconductor layer 11 and the second semiconductor layer 12 have different lattice structures, and non-coincident crystallographic directions in the horizontal direction.

The first semiconductor layer 11 comprises a lower Si (100) semiconductor layer, and the second semiconductor layer 12 comprises an upper Si (111) semiconductor layer. The <−211> direction of the upper Si (111) semiconductor layer and the <−110> direction of the lower Si (100) semiconductor layer have an angle therebetween. The angle is an angle other than 90° nor an integer multiple of 90°. Preferably, the first semiconductor layer 11 and the second semiconductor layer 12 may be alternately laminated to form a composite structure. With this embodiment, the cleavage planes of the upper Si (111) semiconductor layer and the lower Si (100) semiconductor layer are not in the same direction, thus cracking of the silicon substrate due to accumulation of stresses can be avoided, and reliability of the substrate is greatly improved.

It should be noted that, in this embodiment, the semiconductor substrate 1 may be formed by laminating three or more semiconductor layers. A semiconductor epitaxial layer 2 may be prepared on the semiconductor substrate 1. Here, the semiconductor layers include a first semiconductor layer 11 and a second semiconductor layer 12. When the semiconductor substrate comprises two or more first semiconductor layers, the plurality of first semiconductor layers have the same lattice structure, the same crystallographic direction in the vertical direction, and coincident or non-coincident crystallographic directions in the horizontal direction. Similarly, when the semiconductor substrate comprises two or more second semiconductor layers, the plurality of second semiconductor layers have the same lattice structure, the same crystallographic direction in the vertical direction, and coincident or non-coincident crystallographic directions in the horizontal direction.

Figure 6:
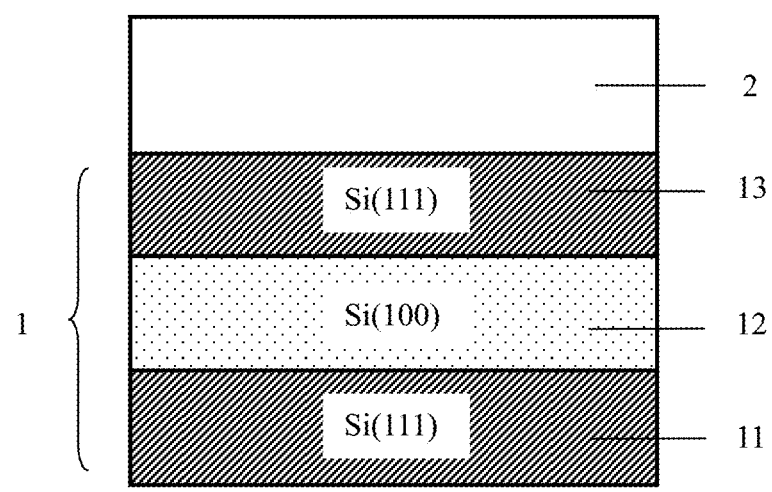
FIG. 6 is a schematic view illustrating a semiconductor substrate according to a fifth embodiment of the present invention in which the substrate is a composite substrate comprising alternately laminated Si (111) layer and Si (100) layer.

FIG. 6 is a schematic view illustrating a semiconductor substrate according to a fifth embodiment of the present invention. As an example, a composite substrate shown in FIG. 6 comprises three semiconductor layers, i.e., a first semiconductor layer 11, a second semiconductor layer 12 and a first semiconductor layer 13 from bottom to up. Here, the first semiconductor layer 11 and the second semiconductor layer have the same crystal structure, the same crystallographic direction in the vertical direction, and coincident or non-coincident crystallographic directions in the horizontal direction.

The first semiconductor layer and the second semiconductor layer are sequentially and alternately laminated so as to form a laminated structure including three semiconductor layers. In this embodiment, the first semiconductor layer comprises a lower Si (111) semiconductor layer, the second semiconductor layer 12 comprises an upper Si (100) semiconductor layer.

It should be noted that the semiconductor substrate formed by laminating the first semiconductor layer 11 and the second semiconductor layer 12 sequentially and alternately is not limited to the three-layer structure shown in FIG. 6. In practice, as an expansion of this embodiment, by laminating the first semiconductor layer 11 and the second semiconductor layer 12 sequentially and alternately, a laminated structure including more than three layers can be formed.

When the first semiconductor layer 11 is Si (111) and the second semiconductor layer 12 is Si (100), in this embodiment, by laminating the first semiconductor layer 11 and the second semiconductor layer 12 sequentially and alternately, a composite substrate structure including Si (111), Si (100), Si (111) and Si (100) can be formed. With this method, the cleavage planes of various silicon semiconductor layers are ensured to not be in the same direction, thus cracking of the silicon substrate due to accumulation of stresses can be avoided, and reliability of the substrate is greatly improved.

Further, in the laminated structure which has three or more layers and is formed by laminating the first semiconductor layer 11 and the second semiconductor layer 12 sequentially and alternately, a dielectric layer (not shown in FIG. 6) may be further included between the first and second semiconductor layers 11 and 12. A dielectric layer material may be one of $SiO_2$, SiN, AlN and the like.

The dielectric layer and the adjacent first semiconductor layer 11 have the same crystallographic direction in the vertical direction and non-coincident crystallographic directions in the horizontal direction; and/or the dielectric layer and the adjacent second semiconductor layer 12 have the same crystallographic direction in the vertical direction and non-coincident crystallographic directions in the horizontal direction.

On the one hand, a dielectric layer material may be amorphous, and thus can be used as a buffer layer of the substrate material, so that stress accumulation is reduced. On the other hand, the material of the dielectric layer may have a high dielectric constant (e.g., the dielectric constant of $SiO_2$ is 3.9, the dielectric constant of SiN is 7.0, and the dielectric constant of AlN is 8.5) and a high critical breakdown electrical field. Under the premise of ensuring that the substrate can withstand a sufficient breakdown voltage, the dielectric material may have a sufficient thickness. Thus, the quality of the dielectric material can be ensured, robustness and reliability of the substrate material can be improved.

Figure 7:
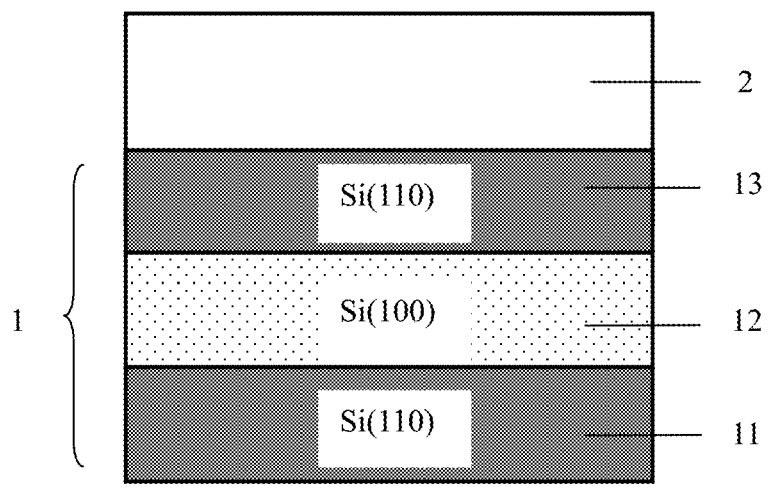
FIG. 7 is a schematic view illustrating a semiconductor substrate according to a sixth embodiment of the present invention in which the substrate is a composite substrate comprising alternately laminated Si (110) layer and Si (100) layer.

FIG. 7 is a schematic view illustrating a semiconductor substrate according to a sixth embodiment of the present invention in which the substrate is a composite substrate comprising alternately laminated Si (110) layer and Si (100) layer. In this embodiment, a semiconductor substrate 1 can be formed by alternately laminating three or more semiconductor layers. A semiconductor epitaxial layer 2 may be prepared on the semiconductor substrate 1. Here, the semiconductor layers include a first semiconductor layer 11 and a second semiconductor layer 12.

As an example, the composite substrate shown in FIG. 7 comprises three semiconductor layers, i.e., a first semiconductor layer 11, a second semiconductor layer 12 and a first semiconductor layer 13 from bottom to up. Here, the first semiconductor layer 11 and the second semiconductor layer have the same crystal structure, the same crystallographic direction in the vertical direction, and coincident or non-coincident crystallographic directions in the horizontal direction. In this embodiment, the first semiconductor layer comprises a lower Si (110) semiconductor layer, the second semiconductor layer 12 comprises an upper Si (100) semiconductor layer.

In this embodiment, by laminating the first semiconductor layer 11 and the second semiconductor layer 12 sequentially and alternately, a composite substrate structure including Si (110), Si (100), Si (110) and Si (100) can be formed. The composite substrate may include a laminated structure having three or more layers. With this method, the cleavage planes of various silicon semiconductor layers are ensured to not be in the same direction, thus cracking of the silicon substrate due to accumulation of stresses can be avoided, and reliability of the substrate is greatly improved.

Furthermore, the laminated structure may further comprise a dielectric layer (not shown in FIG. 7) between the first and second semiconductor layers 11 and 12. A material of the dielectric layer may be one of $SiO_2$, SiN, AlN and the like. The dielectric layer and the adjacent first semiconductor layer 11 and/or the adjacent second semiconductor layer 12 have the same crystallographic direction in the vertical direction and non-coincident crystallographic directions in the horizontal direction; or the dielectric layer and the adjacent first semiconductor layer 11 and/or the adjacent second semiconductor layer 12 have different lattice structures, and non-coincident crystallographic directions in the horizontal direction. On the one hand, the dielectric layer can be used as a buffer layer of the substrate material, so that stress accumulation is reduced. On the other hand, the material of the dielectric layer may have a high dielectric constant (e.g., the dielectric constant of $SiO_2$ is 3.9, the dielectric constant of SiN is 7.0, and the dielectric constant of AlN is 8.5). Under the premise of ensuring that the substrate can withstand a sufficient breakdown voltage, the dielectric material may have a sufficient thickness. Thus, the quality of the dielectric material can be ensured, robustness and reliability of the substrate can be improved.

Figure 8:
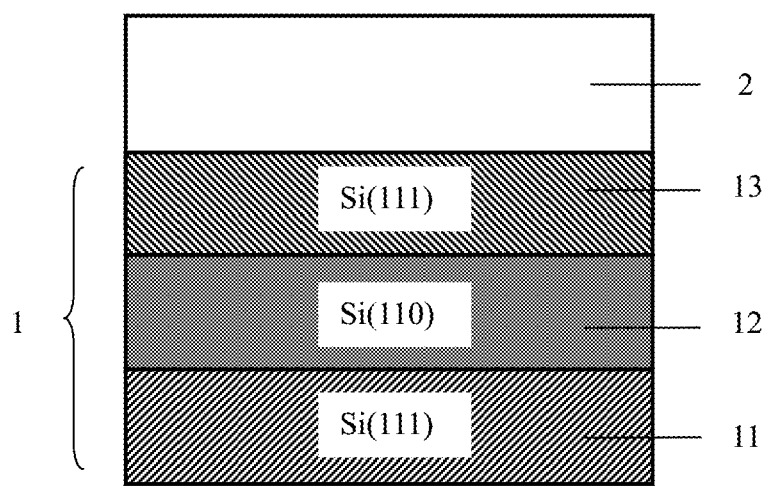
FIG. 8 is a schematic view illustrating a semiconductor substrate according to a seventh embodiment of the present invention in which the substrate is a composite substrate comprising alternately laminated Si (111) layer and Si (110) layer.

FIG. 8 is a schematic view illustrating a semiconductor substrate according to a seventh embodiment of the present invention in which the substrate is a composite substrate comprising alternately laminated Si (111) layer and Si (110) layer. In this embodiment, a semiconductor substrate 1 can be formed by alternately laminating three or more semiconductor layers. A semiconductor epitaxial layer 2 may be prepared on the semiconductor substrate 1. Here, the semiconductor layers include a first semiconductor layer 11 and a second semiconductor layer 12.

The composite substrate shown in FIG. 8 comprises three semiconductor layers, i.e., a first semiconductor layer 11, a second semiconductor layer 12 and a first semiconductor layer 13 from bottom to up. Here, the first semiconductor layer 11 and the second semiconductor layer have the same crystal structure, the same crystallographic direction in the vertical direction, and coincident or non-coincident crystallographic directions in the horizontal direction. The first semiconductor layer and the second semiconductor layer are laminated sequentially and alternately so as to form a composite structure including three or more layers. In this embodiment, the first semiconductor layer comprises a lower Si (111) semiconductor layer, the second semiconductor layer 12 comprises an upper Si (110) semiconductor layer. By laminating the two kinds of semiconductor layers, the composite substrate structure including Si (111), Si (110), Si (111) and Si (110) can be formed. With this method, the cleavage planes of various silicon semiconductor layers are ensured to not be in the same direction, thus cracking of the silicon substrate due to accumulation of stresses can be avoided, and reliability of the substrate is greatly improved.

Further, the laminated structure may further comprise a dielectric layer between the first and second semiconductor layers. A dielectric layer material may be one of $SiO_2$, SiN, AlN and the like. The dielectric layer and the adjacent first semiconductor layer and/or the adjacent second semiconductor layer have the same crystallographic direction in the vertical direction and non-coincident crystallographic directions in the horizontal direction; or the dielectric layer and the adjacent first semiconductor layer and/or the adjacent second semiconductor layer have different lattice structures, and non-coincident crystallographic directions in the horizontal direction. On the one hand, a dielectric layer material may be amorphous, and thus can be used as a buffer layer of the substrate material, so that stress accumulation is reduced. On the other hand, the material of the dielectric layer may have a high dielectric constant (e.g., the dielectric constant of $SiO_2$ is 3.9, the dielectric constant of SiN is 7.0, and the dielectric constant of AlN is 8.5) and a high critical breakdown electrical field. Under the premise of ensuring that the substrate can withstand a sufficient breakdown voltage, the dielectric material may have a sufficient thickness. Thus, the quality of the dielectric material can be ensured, robustness and reliability of the substrate material can be improved.

To sum up, as long as the first semiconductor layer and the second semiconductor layer in the substrate, or semiconductor layers obtained by symmetrically rotating the first semiconductor layer and the second semiconductor layer according to their respective lattice structures, have different cleavage planes in the vertical direction, stress accumulation at an interface between the first and second semiconductor layers can be reduced. Therefore, diffusion of stresses accumulated locally in the second semiconductor layer to the whole semiconductor layer is avoided and thus cracking of the whole silicon substrate is avoided. Specifically, the first semiconductor layer and the second semiconductor layer have different cleavage planes in the vertical direction; a semiconductor layer obtained by symmetrically rotating the first semiconductor layer according to its lattice structure and the second semiconductor layer have different cleavage planes in the vertical direction; the first semiconductor layer and a semiconductor layer obtained by symmetrically rotating the second semiconductor layer according to its lattice structure have different cleavage planes in the vertical direction; a semiconductor layer obtained by symmetrically rotating the first semiconductor layer according to its lattice structure and a semiconductor layer obtained by symmetrically rotating the second semiconductor layer according to its lattice structure have different cleavage planes in the vertical direction.

As can be seen from the above technical schemes, the substrates according to the present invention have special lattice structures and mechanical structures. By providing the semiconductor substrates having composite structures, even if thicknesses of the substrates are not changed, the damages to the silicon substrates due to stresses by the semiconductor epitaxial layers can be reduced, thereby decreasing the likelihood of breakage of the silicon substrates. Furthermore, the processing difficulty is reduced and the reliability of the semiconductor devices is improved.

It will be understood by those skilled in the art that the present invention is not limited to the exemplary embodiments, rather, this invention may be realized in other specific forms without departing from the spirit or features of the present invention. Therefore, the embodiments should be considered as exemplary, not limitative. The scope of the present invention is defined by the appended claims rather than the foregoing description. This invention is intended to cover all modifications included within the spirit and scope of the appended claims and the equivalent arrangements. Any reference numeral in the claims should not be considered as limitation to the claims.

Further, it will be understood that although various embodiments are described in the specification, it does not mean that each embodiment contains only one separate technical scheme. This description manner is just for clarity, the specification should be considered as a whole by those skilled in the art. The technical schemes in various embodiments may be combined to form other embodiments understood by those skilled in the art.

What is claimed is:

1. A semiconductor substrate, comprising a first semiconductor layer and a second semiconductor layer located on the first semiconductor layer; wherein
the first semiconductor layer and the second semiconductor layer have different cleavage planes in a vertical direction; or
a semiconductor layer obtained by symmetrically rotating the first semiconductor layer according to a lattice structure of the first semiconductor layer has a different cleavage plane in the vertical direction as that of the second semiconductor layer; or
a semiconductor layer obtained by symmetrically rotating the second semiconductor layer according to a lattice structure of the second semiconductor layer has a different cleavage plane in the vertical direction as that of the first semiconductor layer; or
the semiconductor layer obtained by symmetrically rotating the first semiconductor layer according to the lattice structure of the first semiconductor layer and the semiconductor layer obtained by symmetrically rotating the second semiconductor layer according to the lattice structure of the second semiconductor layer have different cleavage planes in the vertical direction;
wherein the first semiconductor layer and the second semiconductor layer have different lattice structures, and non-coincident crystallographic directions in a horizontal direction, the first semiconductor layer and the second semiconductor layer are laminated sequentially and alternately to form a laminated structure having three or more layers, and the laminated structure comprises a dielectric layer between the first semiconductor layer and the second semiconductor layer and a third semiconductor layer having a same lattice structure with the first semiconductor layer, wherein the third semiconductor layer and the first semiconductor layer have same cleavage planes in the vertical direction and the second semiconductor layer is located between the first semiconductor layer and the third semiconductor layer.

2. The semiconductor substrate according to claim 1, wherein a material of the first semiconductor layer is one of a crystalline material and an amorphous material or a combination thereof.

3. The semiconductor substrate according to claim 2, wherein the material of the first semiconductor layer is the amorphous material, the amorphous material comprises a non-semiconductor material, the non-semiconductor material is one of aluminum nitride, polycrystalline silicon carbide, ceramics and quartz.

4. The semiconductor substrate according to claim 2, wherein the material of the first semiconductor layer is the amorphous material, a bonding direction of the first semiconductor layer and the second semiconductor layer is not limited.

5. The semiconductor substrate according to claim 1, wherein the second semiconductor layer is a crystalline layer.

6. The semiconductor substrate according to claim 1, wherein the dielectric layer and an adjacent first semiconductor layer have a same crystallographic direction in the vertical direction, and non-coincident crystallographic directions in a horizontal direction;

and/or, the dielectric layer and an adjacent second semiconductor layer have a same crystallographic direction in the vertical direction, and non-coincident crystallographic directions in the horizontal direction.

7. The semiconductor substrate according to claim 1, wherein the dielectric layer and an adjacent first semiconductor layer have different crystal structures, and non-coincident crystallographic directions in a horizontal direction;

and/or, the dielectric layer and an adjacent second semiconductor layer have different crystal structures, and non-coincident crystallographic directions in the horizontal direction.

8. A manufacturing method of a semiconductor substrate, comprising:

S1. providing a first semiconductor layer; and

S2. preparing a second semiconductor layer on the first semiconductor layer, the first semiconductor layer and the second semiconductor layer having different lattice structures, and non-coincident crystallographic directions in a horizontal direction, wherein after the step S2, the method further comprises:

preparing a third semiconductor layer on the second semiconductor layer to form a laminated structure having three layers, wherein third semiconductor layer has a same lattice structure with the first semiconductor layer, and the third semiconductor layer and the first semiconductor layer have same cleavage planes in a vertical direction; or, preparing a first semiconductor layer and a second semiconductor layer sequentially and alternately on the second semiconductor layer to form a laminated structure having more than three layers;

growing a dielectric layer between the first semiconductor layer and the second semiconductor layer;

and wherein:

the first semiconductor layer and the second semiconductor layer have different cleavage planes in the vertical direction; or a semiconductor layer obtained by symmetrically rotating the first semiconductor layer according to a lattice structure of the first semiconductor layer has a different cleavage plane in the vertical direction as that of the second semiconductor layer; or a semiconductor layer obtained by symmetrically rotating the second semiconductor layer according to a lattice structure of the second semiconductor layer has a different cleavage plane in the vertical direction as that of the first semiconductor layer; or the semiconductor layer obtained by symmetrically rotating the first semiconductor layer according to the lattice structure of the first semiconductor layer and the semiconductor layer obtained by symmetrically rotating the second semiconductor layer according to the lattice structure of the second semiconductor layer have different cleavage planes in the vertical direction.

9. The manufacturing method according to claim 8, wherein the first semiconductor layer and the second semiconductor layer are prepared with one of a Czochralski method, a zone melting method, a physical vapor deposition method and a chemical vapor deposition method or a combination thereof.

10. The manufacturing method according to claim 8, wherein in the step S2, wafer bonding is used to prepare the second semiconductor layer on the first semiconductor layer.

11. The manufacturing method according to claim 8, after the step S2 further comprising:

preparing a semiconductor epitaxial layer on the second semiconductor layer;

wherein the semiconductor epitaxial layer is prepared with one of a metal organic chemical vapor deposition method, a molecular beam epitaxy method and a hydride vapor phase epitaxy method or a combination thereof.

12. The manufacturing method according to claim 8, wherein the dielectric layer is made with one of deposition, thermal oxidation and nitridation, the deposition is one of CVD, PECVD, LPCVD, RTCVD, MOCVD, MBE, ALD or a combination thereof.

\* \* \* \* \*